(12) United States Patent
Berglund

(10) Patent No.: US 9,545,007 B2
(45) Date of Patent: Jan. 10, 2017

(54) POWER CHAIN ON A CIRCUIT BOARD

(71) Applicant: INCO INNOVATION, Jäfälla (SE)

(72) Inventor: Jan Berglund, Järfälla (SE)

(73) Assignee: One Inventor Sweden AB, Järfallä (SE)

( * ) Notice: Subject to any disclaimer, the term of this patent is extended or adjusted under 35 U.S.C. 154(b) by 76 days.

(21) Appl. No.: 14/354,997

(22) PCT Filed: Aug. 10, 2013

(86) PCT No.: PCT/SE2013/050961
§ 371 (c)(1),
(2) Date: Apr. 29, 2014

(87) PCT Pub. No.: WO2014/035314
PCT Pub. Date: Mar. 6, 2014

(65) Prior Publication Data
US 2014/0338964 A1   Nov. 20, 2014

(30) Foreign Application Priority Data

Aug. 29, 2012 (SE) ...................................... 1230086

(51) Int. Cl.
*H05K 1/11* (2006.01)
*H05K 1/18* (2006.01)
*H05K 1/02* (2006.01)

(52) U.S. Cl.
CPC ............ *H05K 1/181* (2013.01); *H05K 1/0263* (2013.01); *H05K 2201/0379* (2013.01); *H05K 2201/1028* (2013.01); *H05K 2201/10189* (2013.01); *H05K 2201/10272* (2013.01)

(58) Field of Classification Search
CPC .......... H05K 3/06; H05K 3/34; H05K 3/3447; H05K 13/61; B23K 1/00; B23K 3/00; B23K 3/87; H01R 12/00
USPC ....... 174/261; 228/215; 248.1; 439/483, 495
See application file for complete search history.

(56) References Cited

U.S. PATENT DOCUMENTS

| 4,603,927 | A | | 8/1986 | Gardner | |
|---|---|---|---|---|---|
| 5,871,325 | A | * | 2/1999 | Schmidt | H05K 13/0061 198/817 |
| 6,705,505 | B2 | * | 3/2004 | Yoshikawa | B23K 3/0638 118/110 |
| 6,857,361 | B2 | * | 2/2005 | Sakai | H05K 3/1225 101/123 |
| 2004/0018396 | A1 | * | 1/2004 | Dorren | H01R 4/02 429/7 |

(Continued)

FOREIGN PATENT DOCUMENTS

| DE | 1-224713 | 12/2003 |
|---|---|---|
| DE | 102011004526 A1 | 8/2012 |

(Continued)

OTHER PUBLICATIONS

International Search Authority (ISA), International Search Report, PCT/SE2013/050961, Dated January 14, 2014.

*Primary Examiner* — Xiaoliang Chen
(74) *Attorney, Agent, or Firm* — Reichel Stohry LLP; Mark C. Reichel; Natalie J. Dean

(57) ABSTRACT

A power chain consisting of a chain comprising links that are electrically conductive elements mounted on a circuit board in at least two layers and in such a way that the elements included in the power chain are assembled shifted and overlapping and in electrical contact with each other.

20 Claims, 3 Drawing Sheets

(56) References Cited

U.S. PATENT DOCUMENTS

| | | | | |
|---|---|---|---|---|
| 2004/0124003 A1* | 7/2004 | Ryu | ............... | H05K 1/118 174/254 |
| 2005/0067472 A1* | 3/2005 | Ohtsuki | ............... | B23K 1/0016 228/248.1 |
| 2009/0045478 A1* | 2/2009 | Hui | ............... | H01L 27/14618 257/434 |
| 2009/0189291 A1* | 7/2009 | Landau | ............... | H01L 23/49537 257/777 |
| 2010/0126829 A1* | 5/2010 | Nicolet | ............... | B65G 49/064 198/465.3 |
| 2012/0051052 A1* | 3/2012 | Wagatsuma | ............... | F21S 4/006 362/249.01 |
| 2012/0250925 A1* | 10/2012 | Lillelund | ............... | H04R 19/016 381/355 |
| 2013/0256856 A1* | 10/2013 | Mahler | ............... | H01L 21/76816 257/676 |
| 2013/0308672 A1* | 11/2013 | Pan | ............... | H01S 5/42 372/50.124 |

FOREIGN PATENT DOCUMENTS

| | | |
|---|---|---|
| EP | 1711040 A1 | 10/2006 |
| JP | 2011229213 A | 11/2011 |

\* cited by examiner

POWER CHAIN ON A CIRCUIT BOARD

PRIORITY

The present application is related to, and claims the priority benefit of, International Patent Application Serial No. PCT/SE2013/050961, filed Aug. 10, 2013, which is related to, and claims the priority benefit of, Sweden Patent Application Serial No. 1230086-9, filed Aug. 29, 2012. The contents of each of these applications are hereby incorporated by reference in their entirety into this disclosure.

DESCRIPTION OF THE INVENTION

This invention relates to a power chain consisting of a number of electrically conductive elements that are mounted on a circuit board in two layers, assembled together with overlapping joints. In that way they form a chain where each element is a link. The chain is placed and soldered on top of a conductor in order to increase its cross-sectional area. The elements are preferably made of copper and can be surface treated with a layer of tin or passivated to avoid oxidation, and by that improving the solder ability. The chain with its elements is meant to be automatically assembled to the circuit board in the same assembly line as the rest of the electrical components. The circuit boards that will benefit the most from this invention is power supply boards since there job is to supply other boards with electrical power and therefore generates high currents. The elements are shaped so that they easily can be taped on reels or placed in trays for mounting in the same machines as the other surface mounted components, SMD:s.

Circuit boards are normally built up of epoxy laminate that has been covered with a thin layer of copper on both sides. They can be glued together with epoxy making multi layer boards. A circuit board is usually up to a few millimeters thick and the copper layers up to about 100 micrometers thick. When manufacturing a circuit board all copper between the conductors are etched away and the holes are drilled, then the inner walls of the holes are covered with copper electrochemically. One problem with circuit board manufacturing is that if the copper layer is too thick, the conductors will be under-etched. That means that the cross-section of a conductor looks like a railway track with grooves on the sides. This is partly an effect due to the fact that it takes a long time to etch, but also since the edge of the conductor is high it makes the acid etching in from the sides. For that reason it is preferred to use thinner layer of copper especially for the narrow conductors since they can actually be cut of by the etching process. As a result, also the wide conductors have to use thinner copper layers since the whole board is processed simultaneously.

The power chain is suitable to mount on the conductors that have to carry high currents and the chain increases there cross-sectional area significantly. Since the elements are mounted overlapping the actual effect is that the cross-sectional area easily can increase up to a factor 20. As an example; a conductor of copper on the PCB (printed circuit board) is 10 mm wide and 50 μm thick gets its thickness enhanced with the use of elements having a thickness of 1 mm and a width of 9.5 mm. Then the thickness changes from 0.05 mm to 1.05 mm, and the cross-sectional area changes from 0.5 mm$^2$ to 10 mm$^2$. The average increase of area is actually bigger since the copper thickness is doubled in the overlapping regions.

The positioning of the elements is very exact because they are automatically mounted, and the process can be done many times with good precision and low variance. In order to improve the solderability the PCB:s are prepared for assembly by a layer of solder paste on the conductors that are going to be assembled with a power chain. Normally the solder paste is screen printed but it can also be dispensed with the use of a jet printer. There are types of solder paste with a higher viscosity that also can be automatically mounted, they are called preforms. See Dangrongs U.S. Pat. No. 6,095,400 that shows a strengthened variant of preform.

When the power chain is to be mounted the first layer is mounted in rows on the conductors with a solder paste layer. Then circular preforms are mounted on top of each element, at the ends, on the surfaces where the overlapping up to the next layer will be done. An alternative would be to let each element be prepared with solder paste on its surface facing down, then there is no need for mounting preforms at all. Finally the next layer of elements are mounted shifted so they link together with the previous layer and form a coherent chain. Now we have a power chain that is built up from the bottom and up with; one thin copper layer, solder paste, a thick but incremental copper layer, preforms or solder paste and finally a thick but incremental copper layer. But since the two layers of elements are shifted and overlapping each other, the electrical and thermal effect is one thick conductive chain after soldering in an oven. The technique to mount components on top of each other is known as PoP, Package-on-Package and is as an example used when building digital memories with high capacity. They are built in many layers and the connections facing up are jet-printed with solder paste and then soldered together with the next layers connections facing down. See Kametanis patent JP7032591.

After soldering there are thin layers of tin between the copper elements. Copper has around 8 times better conductivity than tin, the dimensions can easily be designed so that the surface area of the overlapping circle is about 8 times bigger than the vertical cross-section area of the elements. Then there is a chain without any weak links, there will just be a very small constant electrical resistant throughout the chain. And with a very small resistant, there will be very small amounts of heat generated when a high current is passing through the chain.

The PCB conductor that includes a power chain does not even have to be continuous. Since the conductors cross-section area is just a fraction of the elements the conductor can be designed as a number of short stubs where each one is designed to receive one element from the first layer. This dividing of a conductor into short stubs that only becomes coherent after the chain is assembled gives an opportunity for other conductors to cross right under the elements of the second layer. In that way it's as if the power chain ads an extra layer to the circuit board, elements from the second layer acts like bridges.

An alternative to tin soldering would be the use of electrically conductive glue or adhesive and simply glue the elements to each other and to the PCB. In this case the elements does not even have to be placed on a conductor, it can be placed directly on the epoxy laminate.

An element has preferably a flat elongated body with, seen from above, fully rounded corners in the ends. That design makes it possible to form a chain in many different angles without any part sticking out outside the edges of the underlying conductor. It might be an advantage to use extra long elements on the second layer every now and then so that more of the other conductors can cross under the power chain. There might also be beneficial to have elements that can split up a conductor into two or even three conductors.

See FIGS. 3b and 4b. Another type of element has a bend of 180° creating a roof on top of itself. The reason for choosing 180° is that the automatic mounting machines prefer a flat surface when picking up the elements from the reel or tray. On the top part a threaded hole can be placed, either with an insert nut or by threading the element itself. The thread is designed for receiving a screw from above so that a cable or an electrical component can be mounted to the element. By that creating yet another layer of electrical connections, this time they can be cables or copper plates. The connection could also be without thread and instead be designed for soldering or just a spring loaded connector type but when there are very high currents a screw connection is normally more reliable. The reason for that is that the torque from a screw gives a high pressure on the connection which is important in order to keep the connecting area as big as possible. If this area becomes small due to loss of pressure the temperature raises immediately in the joint due to higher resistance, it might even start a fire. Cable connections can be internal on the same board or external to the surrounding electronics. The connector element can also be used for mounting and connecting a power diode or power transistor. Then the power chain also will serve as a cooling device for the components since the heat is conducted from the component through the chain. Then, with the use of an element with integrated cooling fins, that heat can be transferred to the surrounding air. Combine this with a fan blowing on that cooling fins we have got a simple and very cost effective way to extract heat from a power board. Cooling electronics often includes many details such as heat sinks, springs, heat conductive paste and screws and it also contains a lot of manual work when mounting all these details. But with the use of elements with integrated fins, there are few details, and if the power components also are SMD:s, then there is no manual work at all, everything is automatically mounted and jointed.

There might be problems to use elements that are too thick, one is that the weight of the total chain might give trouble if the board is exposed to vibrations. Another problem with thick elements is that they take longer time and/or higher temperature in the oven when being soldered. It takes time to heat up solid copper and the risk is that some other component on the board can't take that increased temperature.

It is of course possible to build more than two layers of elements, for example four by building a double chain. But considering what has been said above about heat consumption it's probably better to build with wider elements instead since they get more exposed to the surrounding heat in the oven.

STATE OF THE ART

One common problem in power electronics is that components and conductors get heated due to high currents and resistance. To use wider conductors is a cheap way to reduce resistance and avoid heat to be generated in the conductors. That gives a production process that can be repeated exact over and over again but the drawback is of course that it takes up too much space of the board area. Changing to cables, plates or copper rods in order to increase the capacity is both expensive and very difficult to produce in bigger quantities without jeopardizing the quality. One of the reasons is the manual work needed, that is expensive and not as accurate as etching and automatically mounting processes. Another reason is that every connection such as a screw, connector spring or similar to be used, is a quality risk. It's often the connections that are the weakest link of quality on a circuit board. Maybe that is because the components have improved and we have learned how to handle electronic components, with ESD-clothes and better packing material etc.

One important thing to focus on when designing a power board is the layout of the components involved in a high current loop so that they are close to each other. In that way the high currents are only conducted short distances on the board. This is also important in order to avoid creating a lot of electromagnetic noise that could interfere with other electrical equipments. One way to keep these current loops small is to collect many power components inside a power module, like the IGBT modules. Normally the components inside an IGBT-module are power transistors made of silicon. In such a module the distances are short and many bonding wires are used for every connection to increase the cross-section area. Many parallel bondings will also make it more robust and reduces the risk for a fault in that connection.

If nothing of the above mentioned will work and heat is generated anyway, the next step would be to try to cool down components, for example with forced air and cooling fins. Cooling fins are designed to have as much area as possible in contact with the surrounding air. Then it can transfer the heat into the air, especially if the air is forced to movement with the use of a fan.

Cooling of bigger amounts of heat often requires water cooling, which is very efficient but expensive and in many cases impractical. Instead of cooling fins to the surrounding air these coolers have a number of channels inside where water can pass and remove some of the heat from the cooler. These systems usually need some sort of monitoring and service to avoid leakage, corrosion and similar problems.

One way to cool conductors on a PCB efficiently is by the use of IMS-laminate, also called "copper-clad-laminate", which is a sort of thin PCB with normally only one layer of conductors and one thick aluminum plate integrated on the other side. This board is mounted with the plate against a heat sink, often with heat conductive paste between the plate and the cooler. The board effectively removes the heat generated by components and conductors but is limited by having only one copper layer for the conductors. Because of that these boards are often populated with only power components and another board will be needed for the rest of the electronics involved in controlling the power being generated. The need of two boards and the connections between them increases cost and jeopardizes quality. To only use one layer of copper is of course a big downside since it's not possible for conductors to cross each other with the use of via holes and other layers.

Problem Solved by the Invention

The invention makes it possible to use high currents on a printed circuit board in a cost effective, space saving way, with high quality and there is no risk for under-etching of thin conductors. The big task for the elements is really to avoid the creation of heat in conductors, and to spread the heat that is generated in the power components. This is achieved by reducing the resistivity in the conductors by significantly increasing there cross-section area.

The avoiding of heat being created is an important task since it's expensive to remove the heat created by lack of cross-section area on the PCB conductors. It is also a resource problem since the heat generated in electronics normally cannot be reused; it only decreases the efficiency of the product. That energy is wasted.

Beside the job to reduce the losses when high currents passes through the conductors, the power chain will also help spreading the heat created in the power components. Copper is a very good conductor for electrical current as well as heat. By spreading the heat from the hottest components through the power chains out to bigger areas, the cooling effect is increased and then these components will get an increased lifetime. Using elements with cooling fins will help spreading the heat to the surrounding air in a very cost effective way.

Yet another advantage of the present invention is that it makes it possible to use thin copper layers on the PCB and by doing that, removing the problem of under etching mentioned earlier. This makes it possible to mix power circuits and electronics with fine pitch components on the same board with a common layer buildup. Normally there are only a few conductors that need the really thick copper, even on a board totally dedicated to power supply.

Shows a power chain (1) comprising a chain with links that are electrically conductive elements (2,12) mounted with overlapping areas on a PCB (3)

FIG. 2a

Figure 1:
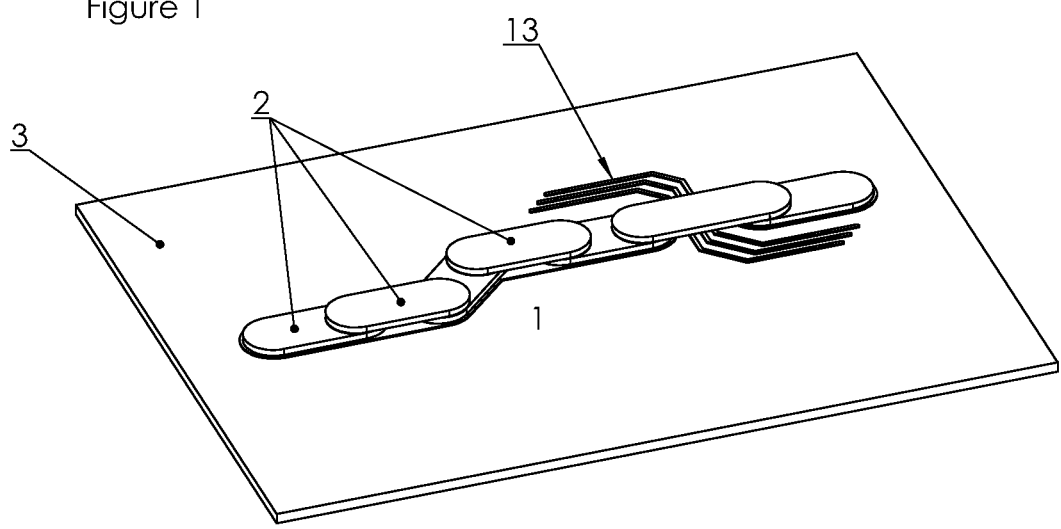
FIG. 1
Figure 2A:
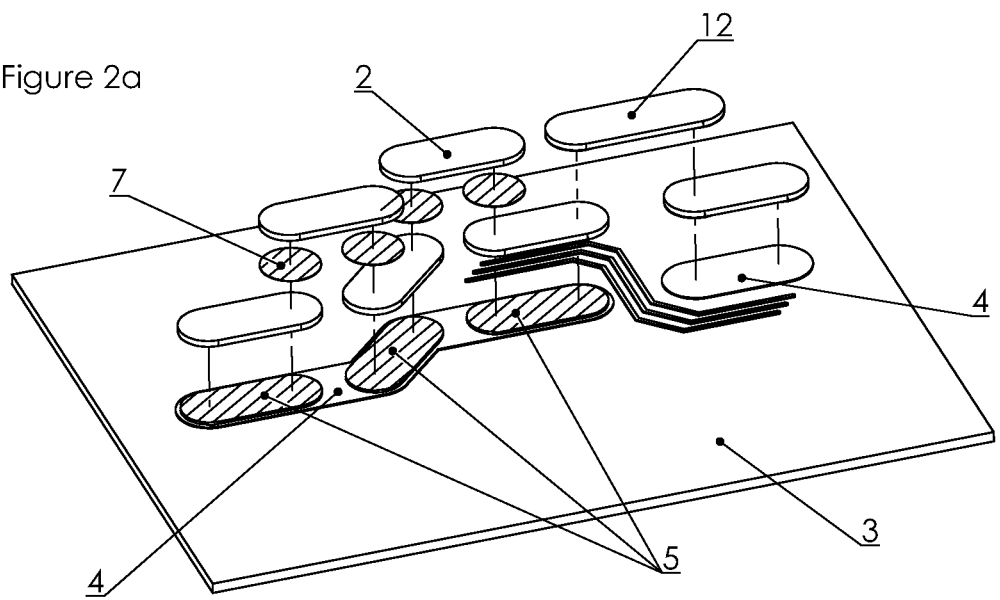
Figure 2B:
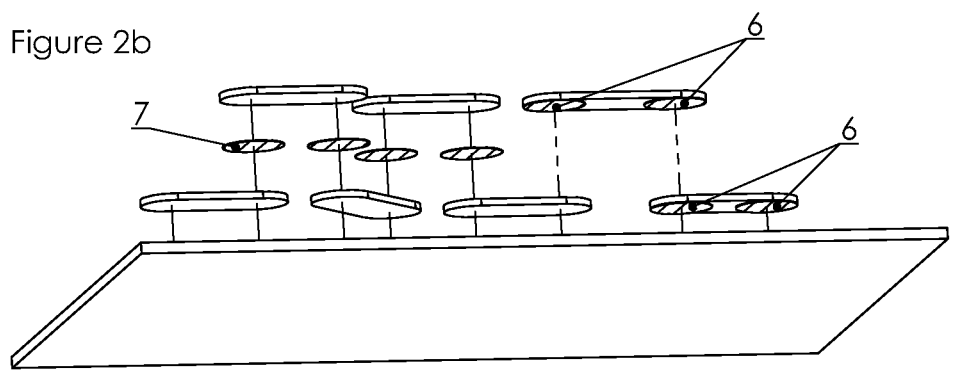
Figure 3A:
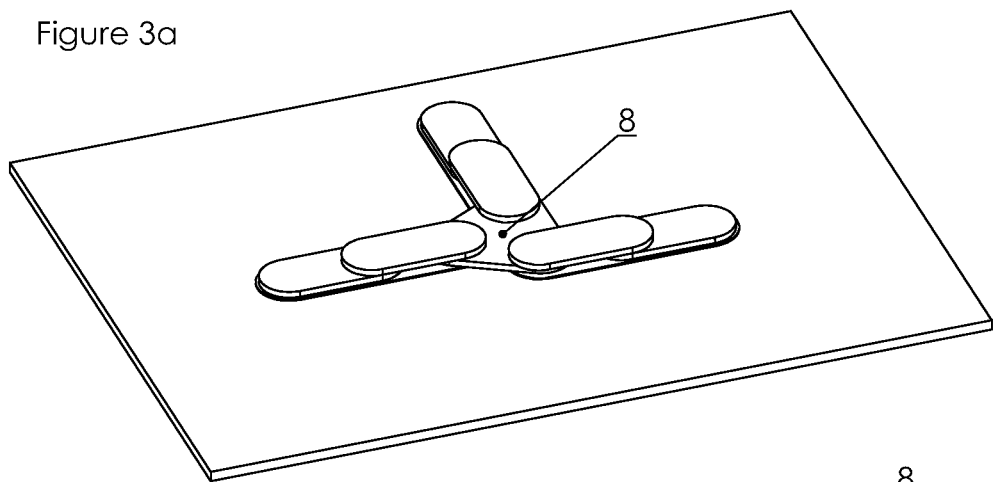
Figure 3B:
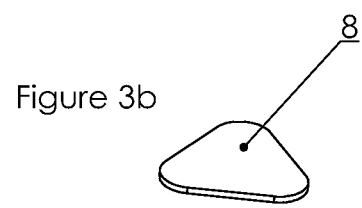
Figure 4A:
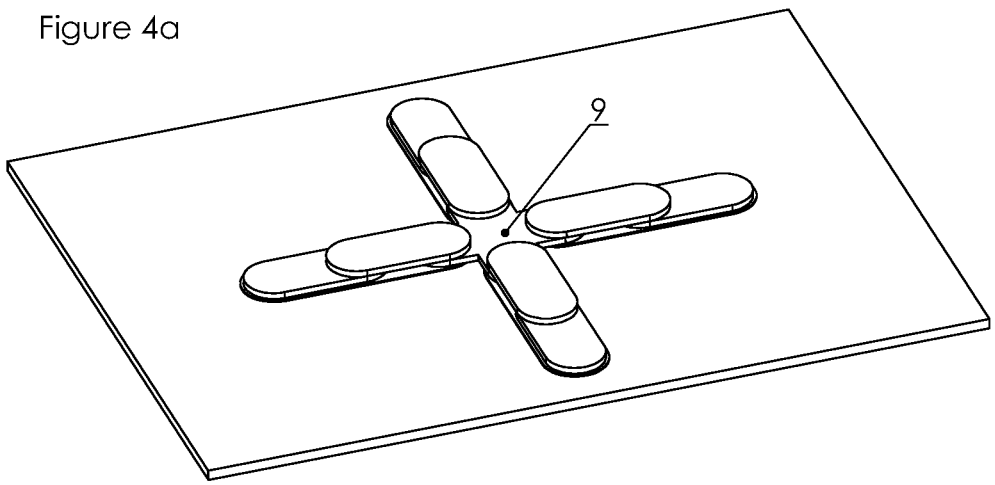
Figure 4B:
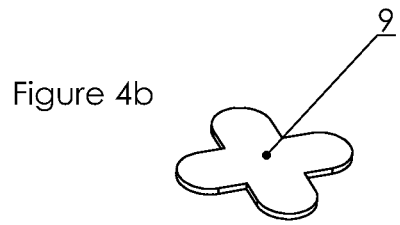
Figure 5:
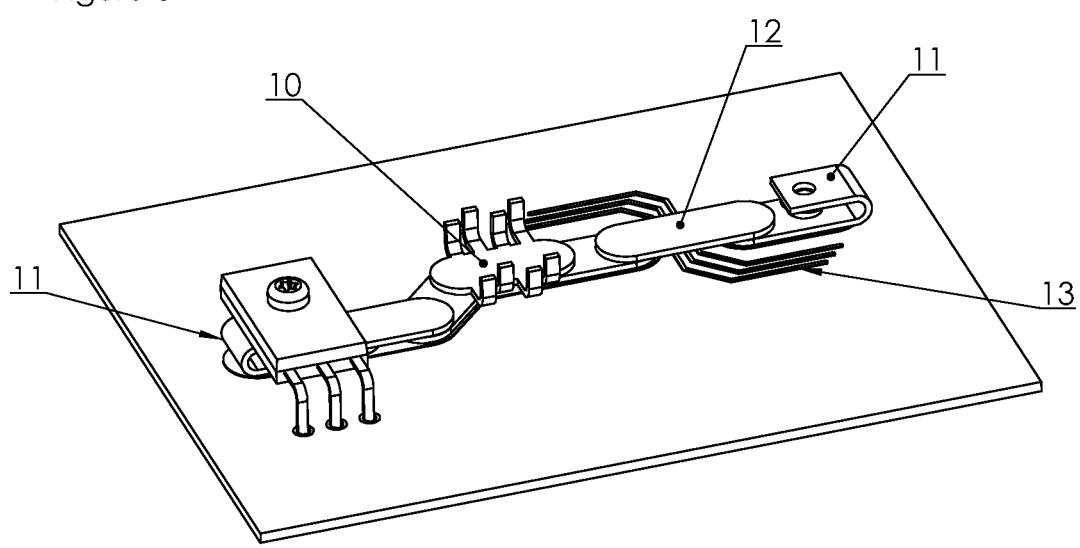

Shows an exploded view of the power chain of FIG. 1 and also showing power conductors (4) with solder paste (5), individual elements (2,12) and preforms (7)

FIG. 2b

Shows the same exploded view as in 2a but in a different perspective showing solder paste (6) attached previously on individual elements under side

FIG. 3a

Shows a power chain being split up in two branches

FIG. 3b

Shows the element (8) that splits up the power chain in two branches

FIG. 4a

Shows a power chain being split up in three branches

FIG. 4b

Shows the element (9) that splits up the power chain in three branches

FIG. 5

Shows a power chain with elements (11) comprising a threaded hole for electrical connection to an electrical component or a cable, an element (12) with elongated body that other conductors (13) can pass under and an element (10) with integrated cooling fins.

The invention claimed is:

1. A power chain consisting of a chain comprising links that are electrically conductive elements mounted on a circuit board characterized by; that the elements included in said power chain are aimed to be automatically mounted on top of each other in at least two layers, assembled shifted, overlapping and in electrical contact with each other, including elements that are overlapping jointed with four other elements.

2. A power chain as in claim 1 comprising elements made of copper.

3. A power chain as in claim 1 with elements having solder paste applied in the joints between each other and the joints to the underlying conductors before soldering.

4. A power chain as in claim 1 with elements having solder paste applied to its underside before assembling.

5. A power chain as in claim 1 with elements that can be angled sideways so that the power chain changes direction.

6. A power chain as in claim 1 that include elements having integrated means for connection to a cable or to an electric component.

7. A power chain as in claim 1 that include elements with an extended body so that conductors can pass under it.

8. A power chain as in claim 1 with elements that are placed on a conductor on said circuit board.

9. A power chain as in claim 1 comprising elements that are surface treated to obtain improved solder ability.

10. A power chain as in claim 1 with elements that are overlapping assembled with the help of electrically conductive glue.

11. A power chain as in claim 1 with elements that are overlapping assembled with soldering.

12. A power chain consisting of a chain comprising links that are electrically conductive elements mounted on a circuit board characterized by; that the elements included in said power chain are aimed to be automatically mounted on top of each other in at least two layers, assembled shifted, overlapping and in electrical contact with each other, that include elements having integrated cooling fins.

13. A power chain as in claim 12 including elements that are overlapping jointed with three other elements.

14. A power chain as in claim 12 with elements that are placed on a conductor on said circuit board.

15. A power chain as in claim 12 comprising elements that are surface treated to obtain improved solder ability.

16. A power chain as in claim 12 with elements that are overlapping assembled with the help of electrically conductive glue.

17. A power chain as in claim 12 with elements having solder paste applied in the joints between each other and the joints to the underlying conductors before soldering.

18. A power chain as in claim 12 with elements that can be angled sideways so that the power chain changes direction.

19. A power chain as in claim 12 that include elements having integrated means for connection to a cable or to an electric component.

20. A power chain as in claim 12 with elements that are overlapping assembled with soldering.

* * * * *